United States Patent
Goto

(10) Patent No.: US 9,912,332 B2
(45) Date of Patent: Mar. 6, 2018

(54) SEMICONDUCTOR DEVICE

(71) Applicant: KABUSHIKI KAISHA TOSHIBA, Tokyo (JP)

(72) Inventor: Yuichi Goto, Hiratsuka Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/233,724

(22) Filed: Aug. 10, 2016

(65) Prior Publication Data
US 2017/0264286 A1 Sep. 14, 2017

(30) Foreign Application Priority Data
Mar. 14, 2016 (JP) .................................. 2016-050079

(51) Int. Cl.
| H03K 3/00 | (2006.01) |
| H03K 17/687 | (2006.01) |
| H01L 29/20 | (2006.01) |
| H01L 29/778 | (2006.01) |
| H01L 29/78 | (2006.01) |
| H01L 27/06 | (2006.01) |

(52) U.S. Cl.
CPC ....... *H03K 17/687* (2013.01); *H01L 27/0629* (2013.01); *H01L 29/2003* (2013.01); *H01L 29/7787* (2013.01); *H01L 29/78* (2013.01)

(58) Field of Classification Search
None
See application file for complete search history.

(56) References Cited

U.S. PATENT DOCUMENTS

| 4,692,643 A * | 9/1987 | Tokunaga | ............ H03K 17/102 327/436 |
| 5,936,360 A * | 8/1999 | Kaneko | ............ H05B 41/3925 315/219 |
| 6,597,210 B2 * | 7/2003 | Carsten | ............ H02M 3/1588 327/108 |
| 6,903,590 B2 * | 6/2005 | Indoh | ............ H03K 17/223 327/172 |
| 6,995,473 B2 * | 2/2006 | Kitabatake | ............ H01L 25/074 257/686 |
| 8,455,948 B2 * | 6/2013 | Weis | ............ H01L 21/823418 257/194 |
| 8,558,587 B2 | 10/2013 | Machida et al. | |

(Continued)

FOREIGN PATENT DOCUMENTS

| JP | 2004-260730 | 9/2004 |
| JP | 2013-013044 | 1/2013 |

(Continued)

Primary Examiner — Lincoln Donovan
Assistant Examiner — Khareem E Almo
(74) Attorney, Agent, or Firm — Patterson & Sheridan, LLP

(57) ABSTRACT

A semiconductor device includes a first transistor and a second transistor connected in series between a first voltage source and a second voltage source. A diode is connected between a gate of the first transistor and the second voltage source. A capacitor is connected to the gate of the first transistor. A first driver is connected to the gate of the first transistor through the capacitor. A second driver is connected to a gate of the second transistor. A threshold voltage of the second transistor is higher than a threshold voltage of the first transistor.

19 Claims, 2 Drawing Sheets

(56) References Cited

U.S. PATENT DOCUMENTS

| | | | |
|---|---|---|---|
| 8,569,842 B2* | 10/2013 | Weis | H01L 27/0207 |
| | | | 257/194 |
| 9,035,690 B2* | 5/2015 | Weis | H03K 17/102 |
| | | | 327/427 |
| 9,100,019 B2* | 8/2015 | Akiyama | H03K 17/94 |
| 9,142,544 B2 | 9/2015 | Ikeda | |
| 9,312,847 B1* | 4/2016 | Li | H03K 17/60 |
| 2011/0291738 A1* | 12/2011 | Biela | H03K 17/08142 |
| | | | 327/430 |

FOREIGN PATENT DOCUMENTS

| JP | 5350074 | | 11/2013 |
|---|---|---|---|
| JP | 2014187726 | A | 10/2014 |

* cited by examiner

SEMICONDUCTOR DEVICE

CROSS-REFERENCE TO RELATED APPLICATION

This application is based upon and claims the benefit of priority from Japanese Patent Application No. 2016-050079, filed Mar. 14, 2016, the entire contents of which are incorporated herein by reference.

FIELD

Embodiments described herein relate generally to a semiconductor device.

BACKGROUND

A conventional high-voltage switching circuit includes a normally-on element and a normally-off element which are series-connected to each other and switches on/off by switching according the normally-off element between conductive and non-conductive states. However, when the normally-off element becomes non-conductive earlier than the normally-on element, an overvoltage may be applied to the normally-off element such that a current may leak through the normally-off element or the normally-off element may be broken down entirely.

A method which causes both of the normally-off element and the normally-on element to perform switching by driving both of the normally-off element and the normally-on element using a common driver has been considered. However, in this method, the switching speed of the entire switching circuit would be rate-limited by the parasitic capacitance of the normally-on element, and, as a result, the switching performance of the normally-off element, which is comparatively fast in switching speed, would not be fully achievable. Thus, it is difficult to provide a device that is fast in switching speed while also preventing current leakage or breaking down.

DETAILED DESCRIPTION

In general, according to one embodiment, a semiconductor device includes a first transistor and a second transistor connected in series between a first voltage source and a second voltage source. A diode is connected between a gate of the first transistor and the second voltage source. A capacitor is connected to the gate of the first transistor. A first driver is connected to the gate of the first transistor through the capacitor. A second driver is connected to a gate of the second transistor. A threshold voltage of the second transistor is higher than a threshold voltage of the first transistor.

Hereinafter, various example embodiments will be described with reference to the drawings. The examples described herein should not be construed to limit the present disclosure.

First Embodiment

Figure 1:
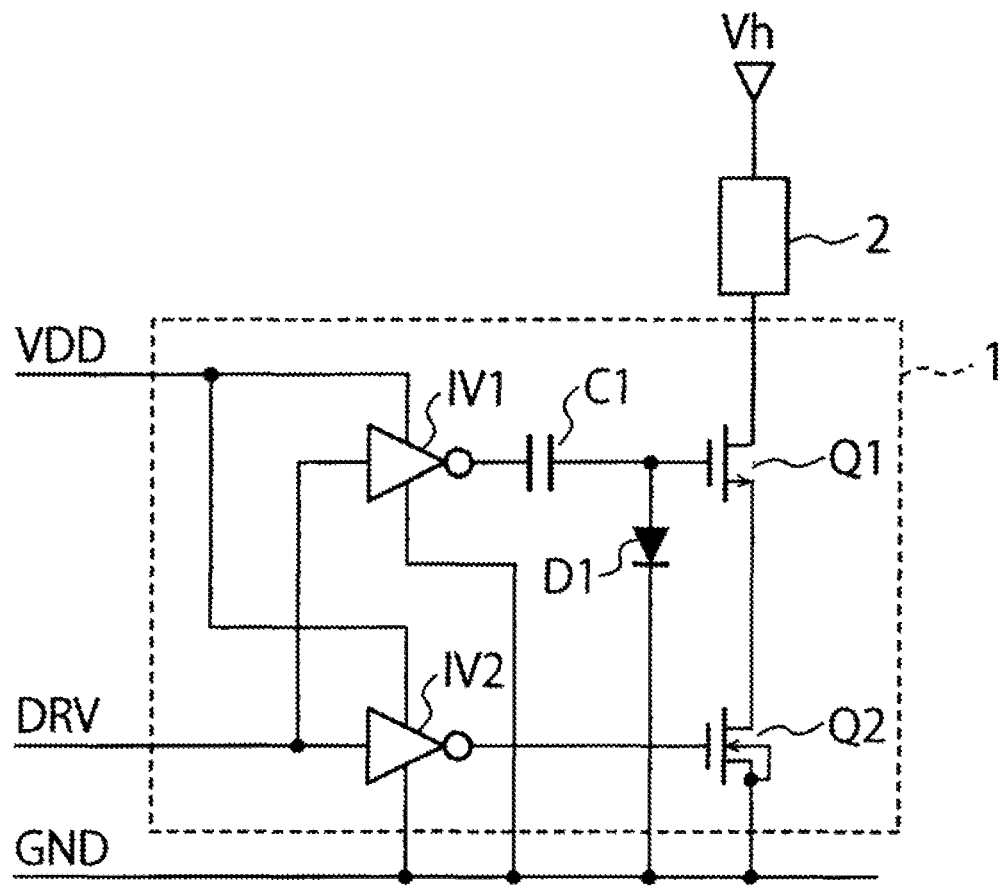
FIG. 1 is a view illustrating an example of a configuration of a high-voltage switching circuit 1 according to a first embodiment.

FIG. 1 is a view illustrating an example of a configuration of a high-voltage switching circuit 1 (hereinafter referred to as a "switching circuit 1") according to a first embodiment. The switching circuit 1 includes a normally-on element Q1, a normally-off element Q2, a diode D1, a capacitor C1, and drivers IV1 and IV2. The switching circuit 1 is interposed between a high-voltage source Vh, which serves as a first voltage source, and a low-voltage source GND, which serves as a second voltage source. The switching circuit 1 receives a drive signal DRV, which serves as a control signal, and electrically connects or disconnects the high-voltage source Vh to the low-voltage source GND according to the drive signal DRV. With this operation, the switching circuit 1 performs switching of supply of electric power from the high-voltage source Vh to a load 2. The load 2, which is electrically connected between the switching circuit 1 and the high-voltage source Vh, is an arbitrary electronic device or apparatus that receives electric power from the high-voltage source Vh to perform an operation or function.

The high-voltage source Vh is, for example, a power source capable of supplying a current of several amperes (A) or more at a voltage equal to or higher than about 200 volts (V). The low-voltage source GND is, for example, ground, but can be any voltage source that supplies a voltage lower than that of the high-voltage source Vh. The drive signal DRV, which serves as a control signal, is, for example, a high-frequency signal with a frequency of several hundred kilohertz (kHz) or more. It is desirable for the switching circuit 1 to have a low on-resistance and a high breakdown voltage and be capable of performing switching at high speed (corresponding to the drive signal DRV, for example). The switching circuit 1 includes the normally-on element Q1 and the normally-off element Q2, which are series-connected between the load 2 and the low-voltage source GND.

The drain of the normally-on element Q1, which serves as a first transistor, is electrically connected to the load 2, and the source of the normally-on element Q1 is electrically connected to the drain of the normally-off element Q2. The gate of the normally-on element Q1 is connected to the output of the first driver IV1 via the capacitor C1. Furthermore, the gate of the normally-on element Q1 is connected to the low-voltage source GND via the diode D1. The normally-on element Q1 is, for example, a gallium nitride-based (GaN-based) high electron mobility transistor (HEMT) with a two-dimensional electron gas (2DEG) used as a carrier. The GaN-based HEMT has an advantage in having a high voltage-withstanding capability and a low on-resistance compared to a metal insulator semiconductor field effect transistor (MISFET) formed on a silicon substrate. The normally-on element Q1 is a switching element, such as a transistor, that is in a conductive state when no voltage is being applied to the gate thereof. The normally-on element Q1 can be brought into a nonconductive state by applying a voltage to the gate thereof. For example, in a case where the normally-on element Q1 is an n-type GaN-based HEMT, the normally-on element Q1 enters a conductive state when the gate voltage is approximately equal to the ground voltage, and enters a nonconductive state when the gate voltage is a negative voltage.

The drain of the normally-off element Q2, which serves as a second transistor, is electrically connected to the source of the normally-on element Q1, and the source of the normally-off element Q2 is electrically connected to the low-voltage source GND. The gate of the normally-off element Q2 is electrically connected to the output of the second driver IV2. The normally-off element Q2 is, for example, an enhancement-type MISFET. The MISFET, which can be formed on a silicon substrate, is generally lower in voltage-withstanding capability than the normally-on element Q1, but has an advantage in being faster in switching speed. Furthermore, the normally-off element Q2 is designed to have an on-resistance less than an on-resistance of the normally-on element Q1. The normally-off element Q2 is an element that is in a nonconductive state when no voltage is applied to the gate thereof. The normally-off element Q2 can be brought into a conductive state by applying a voltage to the gate thereof. For example, in a case where the normally-off element Q2 is an n-type MISFET, the normally-off element Q2 is in a nonconductive state when the gate voltage is approximately equal to the ground voltage, and is in a conductive state when the gate voltage is a positive voltage. Accordingly, the threshold voltage of the normally-off element Q2 is higher than the threshold voltage of the normally-on element Q1. Connecting the normally-on element Q1 and the normally-off element Q2 as described above enables the switching circuit 1 to have a low on-resistance, a high voltage-withstanding capability, and to perform high-speed switching.

The diode D1 is electrically connected between the gate of the normally-on element Q1 and the low-voltage source GND. The anode of the diode D1 is electrically connected to the gate of the normally-on element Q1, and the cathode of the diode D1 is electrically connected to the low-voltage source GND.

One end of the capacitor C1, which serves as a first capacitor, is electrically connected to the gate of the normally-on element Q1, and the other end of the capacitor C1 is electrically connected to the output of the first driver IV1.

The input side (input terminal) of the first and second drivers IV1 and IV2 each receive the drive signal DRV as a common input signal from outside of the switching circuit 1. That is, the drive signal may be supplied from an external source. The output of the first driver IV1 is connected to the gate of the normally-on element Q1 via the capacitor C1, so that the first driver IV1 controls the gate voltage of the normally-on element Q1 based on the drive signal DRV. The output of the second driver IV2 is connected to the gate of the normally-off element Q2, so that the second driver IV2 controls the gate voltage of the normally-off element Q2 based on the drive signal DRV. The drivers IV1 and IV2, which are, for example, inverter elements, output voltage of the high-voltage source VDD or the low-voltage source GND according to the logic (high/low) of the drive signal DRV. The first and second drivers IV1 and IV2 can be identical elements having the same or substantially similar characteristics. However, even if the first and second drivers IV1 and IV2 are identical elements, the inclusion of diode D1 and the capacitor C1 enables the normally-on element Q1 and the normally-off element Q2 to simultaneously turn on/turn off in response to the common drive signal DRV.

For example, when the drive signal DRV is low in logic (at a low-level voltage), the drivers IV1 and IV2 may both output the voltage of the high-voltage source VDD. For example, when the drive signal DRV is high in logic (at a high-level voltage), the drivers IV1 and IV2 may both output the voltage of the low-voltage source GND. The high-voltage source VDD can be the same voltage source as the high-voltage source Vh or may be different.

(Switching Circuit 1 being in an On-State)

When the switching circuit 1 is in an on-state (the connection between high-voltage source Vh through the load 2 to low-voltage source GND is closed), the drive signal DRV will be low in logic in this example. Thus, the first driver IV1 outputs the voltage of the high-voltage source VDD (hereinafter referred to simply as a "voltage VDD"), which attempts to raise the gate voltage of the normally-on element Q1 to the voltage VDD via the capacitor C1. At this time, the diode D1 is in a forward bias and thus releases electric charge from the gate of the normally-on element Q1 to the low-voltage source GND. Accordingly, the gate voltage of the normally-on element Q1 approaches the voltage of the low-voltage source GND (hereinafter referred to simply as a "voltage GND") and becomes a voltage (Vf+GND) obtained by adding a forward voltage drop Vf of the diode D1 to the voltage GND. The threshold voltage of the normally-on element Q1 can be set to a voltage lower than the voltage GND. Accordingly, the normally-on element Q1 is in a conductive state even when the gate voltage thereof is a voltage close to the voltage GND (or Vf+GND).

On the other hand, the second driver IV2 also outputs the voltage VDD and this raises the gate voltage of the normally-off element Q2 to the voltage VDD. The gate voltage of the normally-off element Q2 approaches the voltage VDD, so that the normally-off element Q2 enters a conductive state.

Accordingly, both the normally-on element Q1 and the normally-off element Q2 are in a conductive state at this time, thus electric power from the high-voltage source Vh is supplied to the load 2. In other words, the switching circuit 1 is in an on-state, thus enabling supply of electric power to the load 2.

(Switching Circuit 1 being in an Off-State)

When the switching circuit 1 is in an off-state, the drive signal DRV will be high in logic in this example. Thus, the first driver IV1 outputs the voltage GND, which attempts to lower the gate voltage of the normally-on element Q1 to the voltage GND via the capacitor C1. At this time, the diode D1 is in a backward bias, so prevents electric charge from the low-voltage source GND from flowing to the gate of the normally-on element Q1. With this operation of the diode D1, the gate voltage of the normally-on element Q1 is lowered by as much as the voltage drop of the first driver IV1 from the voltage (Vf+GND). Accordingly, the gate voltage of the normally-on element Q1 becomes a low-level voltage V1 that is lower than the voltage GND. For example, in a case where the voltage VDD is about 8 V and the voltage (Vf+GND) is about 0.6 V, the gate voltage of the normally-on element Q1 becomes a voltage (about −7.4 V) lowered by about 8 V from the voltage (Vf+GND). In other words, in this case, the low-level voltage V1 becomes a negative voltage of about −7.4V. If the threshold voltage of the normally-on element Q1 is set to a voltage between the voltage GND and the low-level voltage V1, the normally-on element Q1 enters a nonconductive state when the gate voltage of the normally-on element Q1 has become the low-level voltage V1.

On the other hand, the second driver IV2 outputs the voltage GND and lowers the gate voltage of the normally-off element Q2 to the voltage GND. The gate voltage of the normally-off element Q2 comes close to the voltage GND, so that the normally-off element Q2 enters a nonconductive state.

Accordingly, although differing in threshold voltage, both the normally-on element Q1 and the normally-off element Q2 enter a nonconductive state owing to the diode D1 and the capacitor C1. As a result, the switching circuit 1 prevents supply of electric power from the high-voltage source Vh to the load 2.

(Switching from the On-State to the Off-State)

When the switching circuit 1 shifts from the on-state to the off-state, the first and second drivers IV1 and IV2 almost simultaneously lower the gate voltage of the normally-on element Q1 and the gate voltage of the normally-off element Q2, respectively, thus causing the normally-on element Q1 and the normally-off element Q2 to almost simultaneously enter a nonconductive state.

If a switching operation was performed using only the normally-off element Q2, the normally-off element Q2 could enter a nonconductive state (turns off) while the normally-on element Q1 still remains in a conductive state. Consequently, the voltage of the high-voltage source Vh would be applied to the normally-off element Q2, so that a leak current might flow through the normally-off element Q2 or the normally-off element Q2 might be broken down due the application of high-voltage source Vh.

If both the normally-on element Q1 and the normally-off element Q2 are configured to be driven by a common driver and the normally-on element Q1 is configured to turn off earlier than the normally-off element Q2, the waveforms of gate voltages of the normally-on element Q1 and the normally-off element Q2 may become unstable and turbulent. The reason for this is as follows. The capacitance between the source and drain of the normally-on element Q1, which is a GaN-based HEMT, is larger than that of the normally-off element Q2. Therefore, when the normally-on element Q1 is non-conductive, a current flow from the high-voltage source Vh to the normally-on element Q1 for a relatively long time period is required to charge the capacitance between the drain and source of the normally-on element Q1. It is considered that, during a period when the current is flowing, the gate voltage of the normally-on element Q1 does not sufficiently decrease and thus remains at the vicinity of the threshold voltage of the normally-on element Q1. Then, when the capacitance between the drain and source of the normally-on element Q1 has been charged, the gate voltage of the normally-on element Q1 sufficiently decreases, so that the normally-on element Q1 turns off.

Figure 2A:
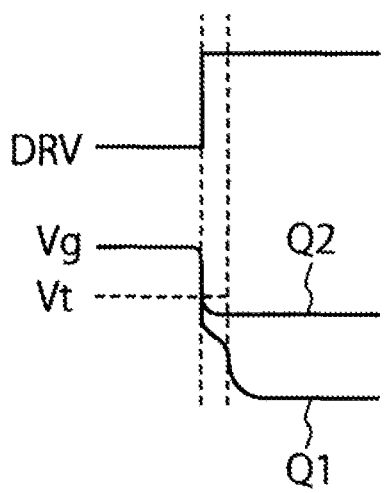
FIGS. 2A and 2B are views illustrating gate voltage waveforms of a normally-on element Q1 and a normally-off element Q2.
Figure 2B:
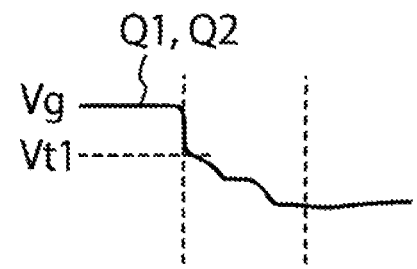

When the gate of the normally-on element Q1 and the gate of the normally-off element Q2 are being driven by the common driver, the gate voltage of the normally-off element Q2 also attempts to remain at the vicinity of the threshold voltage of the normally-on element Q1 as with the gate voltage of the normally-on element Q1 during the period when the capacitance between the drain and source of the normally-on element Q1 is being charged. Accordingly, as illustrated in FIG. 2B, the waveform of the gate voltage of the normally-off element Q2 also becomes unstable and turbulent. As a result, the operation of the normally-off element Q2 becomes unstable, so that the switching performance of the normally-off element Q2 would not be fully realized.

On the other hand, in the case of the switching circuit 1 according to the first embodiment, the normally-on element Q1 and the normally-off element Q2 are driven by the individual first and second drivers IV1 and IV2, respectively, rather than a single, common driver. Therefore, the normally-off element Q2 is driven by the second driver IV2 instead of a single, common driver element being used to drive both the normally-on element Q1 and the normally-off element Q2. Accordingly, the normally-off element Q2 is able to turn off without being affected by the parasitic capacitance of the normally-on element Q1, as illustrated in FIG. 2A. In other words, the gate voltage of the normally-off element Q2 is able to stably decrease without being affected by the parasitic capacitance of the normally-on element Q1. As a result, the operation of the normally-off element Q2 stabilizes. Although a certain amount of current from the high-voltage source Vh flows through the normally-on element Q1 due to the parasitic capacitance thereof, the normally-on element Q1 still turns off almost simultaneously with the normally-off element Q2. Thus, the switching circuit 1 according to the first embodiment can perform a switching operation stably and at high speed.

Furthermore, the inputs of the first and second drivers IV1 and IV2 receive a common drive signal DRV. Accordingly, the first and second drivers IV1 and IV2 are able to almost simultaneously control the normally-on element Q1 and the normally-off element Q2. As a result, the switching operation of the normally-off element Q2 can be stabilized, the switching performance of the normally-off element Q2 can be fully realized, and any overvoltage can be prevented from being applied to the normally-off element Q2.

(Switching from the Off-State to the On-State)

When the switching circuit 1 shifts from the off-state to the on-state, the first and second drivers IV1 and IV2 almost simultaneously raise the gate voltage of the normally-on element Q1 and the gate voltage of the normally-off element Q2, respectively. Accordingly, the normally-on element Q1 and the normally-off element Q2 almost simultaneously enter a conductive state (turn on). Alternatively, the normally-off element Q2 may turn on slightly earlier than the normally-on element Q1.

If a switching operation was performed using only the normally-off element Q2, an overvoltage could be applied to the normally-off element Q2, so that a leak current might flow through the normally-off element Q2 or the normally-off element Q2 might be broken down.

If both the normally-on element Q1 and the normally-off element Q2 were configured to be driven by a single common driver and the normally-off element Q2 is configured to turn on earlier than the normally-on element Q1, when the normally-off element Q2 turns on, the voltage of the node between the normally-on element Q1 and the normally-off element Q2 (the source of the normally-on element Q1) decreases by being pulled down to the low-voltage source GND. This may cause the voltage of the high-voltage source Vh to temporarily vary greatly, thus causing the normally-on element Q1 to turn on by itself. In this case, since the switching operation of the normally-on element Q1 becomes unstable, the switching speed may decrease.

On the other hand, in the case of the switching circuit 1 according to the first embodiment, the normally-on element Q1 and the normally-off element Q2 are driven by the individual first and second drivers IV1 and IV2, respectively. Therefore, the normally-on element Q1 and the normally-off element Q2 almost simultaneously enter an on-state, and the normally-on element Q1 turns on without the source voltage of the normally-on element Q1 decreasing so much. This allows the switching operation of the normally-off element Q2 to stabilize. Furthermore, since the normally-on element Q1 and the normally-off element Q2 almost simultaneously enter an on-state, any overvoltage can be prevented from being applied to the normally-on element Q1 when the switching circuit 1 turns on. This enables increasing the switching speed of the switching circuit 1 while preventing the occurrence of a current leakage and breaking down in the switching circuit 1.

Moreover, the switching circuit 1 according to the first embodiment causes the diode D1 and the capacitor C1 to generate a negative voltage, which is used for the normally-on element Q1. Therefore, the switching circuit 1 does not require a negative voltage source that generates a negative voltage.

Second Embodiment

Figure 3:
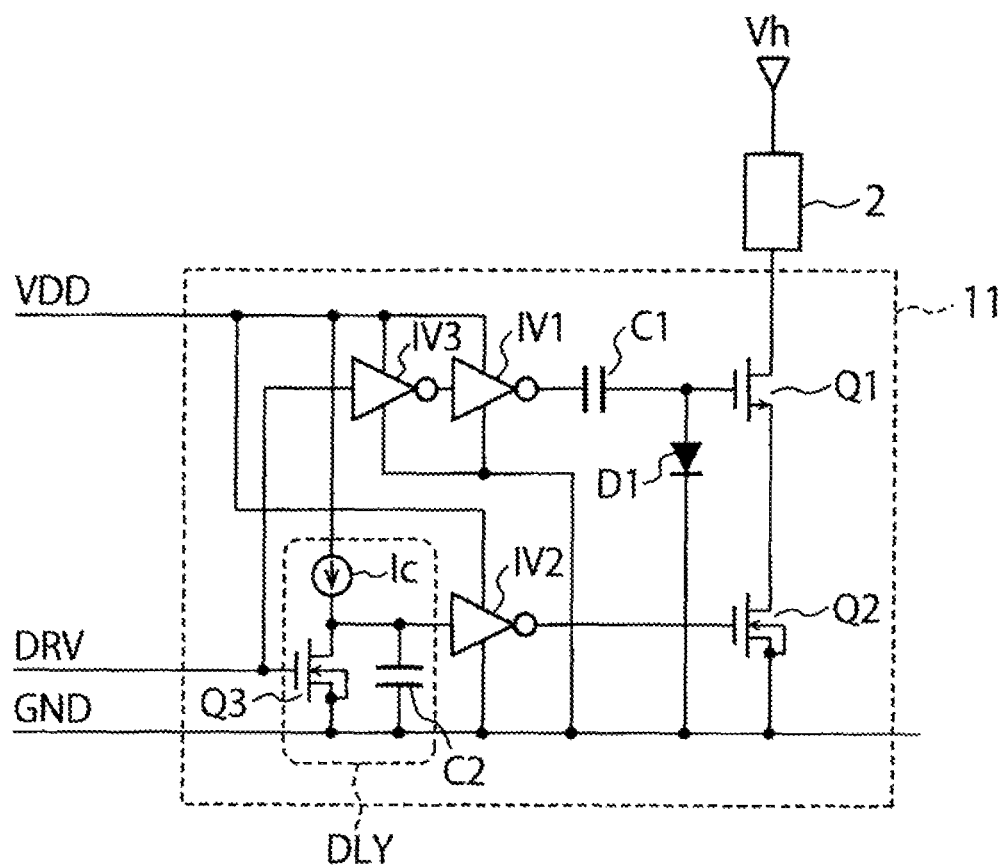
FIG. 3 is a view illustrating an example of a configuration of a high-voltage switching circuit 11 according to a second embodiment.

FIG. 3 is a view illustrating an example of a configuration of a high-voltage switching circuit 11 (hereinafter referred to as a "switching circuit 11") according to a second embodiment. The switching circuit 11 further includes a delay circuit DLY and a third driver IV3 in addition to the constituent elements of the switching circuit 1. The configuration of the second embodiment, excepting for the delay circuit DLY and the third driver IV3, can be similar to the corresponding configuration of the first embodiment.

The delay circuit DLY is connected between the input of the second driver IV2 and an input terminal for the drive signal DRV. The delay circuit DLY includes a transistor Q3 and a capacitor C2.

The drain of the transistor Q3 is electrically connected to the voltage VDD via a constant current source Ic, and the source of the transistor Q3 is electrically connected to the low-voltage source GND. Thus, the transistor Q3 is electrically connected between the high-voltage source VDD and the low-voltage source GND and also between the input of the second driver IV2 and the low-voltage source GND. The gate of the transistor Q3 receives the drive signal DRV. Accordingly, the transistor Q3 outputs the voltage VDD or the voltage GND to the second driver IV2 based on the logic of the drive signal DRV. The transistor Q3 is, for example, an n-type MISFET.

One end of the capacitor C2, which serves as a second capacitor, is electrically connected to the input of the second driver IV2, and the other end thereof is electrically connected to the low-voltage source GND. Thus, the capacitor C2 is electrically connected between the input of the second driver IV2 and the low-voltage source GND. In other words, the capacitor C2 is connected to the transistor Q3 in parallel between the input of the second driver IV2 and the low-voltage source GND.

With this configuration, when the drive signal DRV transitions to high in logic from low in logic, the transistor Q3 enters a conductive state and the input of the second driver IV2 becomes the low voltage VDD. At this time, the capacitor C2 does not have any effect, and the drive signal DRV is input to the second driver IV2 without being delayed. Accordingly, the normally-on element Q1 and the normally-off element Q2 almost simultaneously turn on as in the first embodiment. Alternatively, the normally-off element Q2 may turn on earlier than the normally-on element Q1.

On the other hand, when the drive signal DRV transitions to low in logic from high in logic, the transistor Q3 enters a nonconductive state and the input of the second driver IV2 is connected to the high voltage VDD. At this time, until the capacitor C2 charges, the voltage of the input of the second driver IV2 does not substantially rise. Therefore, the drive signal DRV is delayed according to the magnitude of the capacitance of the capacitor C2. Then, after the capacitor C2 is charged and the voltage of the input of the second driver IV2 has risen, the output of the second driver IV2 inverts to low in logic, so that the normally-off element Q2 turns off.

Accordingly, the normally-on element Q1 turns off first and then the normally-off element Q2 turns off. Thus, the delay circuit DLY delays the drive signal DRV supplied to the normally-off element Q2 when the switching circuit 11 shifts from the on-state to the off-state, but not when the switching circuit 11 shifts from the off-state to the on-state.

The third driver IV3, which is connected to the input of the first driver IV1, receives the drive signal DRV and outputs an inverted signal of the drive signal DRV to the first driver IV1. The third driver IV3 is provided so as to match the logics of the gates of the normally-on element Q1 and the normally-off element Q2.

If the normally-off element Q2 turns off earlier than the normally-on element Q1, as mentioned above, an overvoltage can be applied to the normally-off element Q2 and a leak current may flow through the normally-off element Q2 or the normally-off element Q2 may be broken down. Furthermore, if the normally-off element Q2 turns off earlier than the normally-on element Q1, the gate voltage of the normally-on element Q1 rises together with the source voltage of the normally-on element Q1 due to the capacitance between the gate and source of the normally-on element Q1, so that the gate voltage becomes unstable. Therefore, the waveform of the gate voltage becomes turbulent, so that the switching operation of the normally-on element Q1 becomes unstable. Moreover, since the drain voltage of the normally-off element Q2 rises in increments, the switching loss becomes large. As a result, the switching speed of the switching circuit 11 decreases.

However, in the case of the switching circuit 11 according to the second embodiment, the normally-off element Q2 turns off after the normally-on element Q1 turns off due to the action of the delay circuit DLY. Accordingly, the source voltage and gate voltage of the normally-on element Q1 do not rise and thus are stable. Therefore, the switching operation of the normally-on element Q1 stabilizes. Moreover, since the drain voltage of the normally-off element Q2 also does not rise, the switching loss is prevented. As a result, the switching operation of the entire switching circuit 11 stabilizes, so that the switching speed can also be maintained at high speed.

In a case where the delay time of the delay circuit DLY is longer than the signal period of the drive signal DRV, the normally-off element Q2 may be caused to continue in a conductive state rather than switching to a non-conductive state. In this case, the switching operation is performed without the normally-off element Q2 being switched as the switching operation will be performed by the normally-on element Q1. Accordingly, the switching circuit 11 is able to perform a high-speed switching operation even if the switching operation is performed by the normally-on element Q1.

The turn-on operation of the switching circuit 11 can be similar to that in the first embodiment. Furthermore, also in the case of the switching circuit 11, the normally-on element Q1 and the normally-off element Q2 are driven by the individual first and second drivers IV1 and IV2, respectively, as in the switching circuit 1. Accordingly, the second embodiment can obtain an advantageous effect similar to that of the first embodiment.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor device, comprising:
   a first transistor and a second transistor connected in series between a first voltage source and a second voltage source;
   a diode connected between a gate of the first transistor and the second voltage source;
   a first capacitor connected to the gate of the first transistor;
   a first driver connected to the gate of the first transistor through the first capacitor; and
   a second driver connected to a gate of the second transistor, wherein
   a threshold voltage of the second transistor is higher than a threshold voltage of the first transistor, wherein
   the first transistor is in a conducting state when zero voltage is applied to the gate of the first transistor, and
   the second transistor is in a non-conducting state when zero voltage is applied to the gate of the second transistor.

2. The semiconductor device according to claim 1, wherein the first transistor is a high electron mobility transistor (HEMT).

3. The semiconductor device according to claim 2, wherein the HEMT is GaN-based.

4. The semiconductor device according to claim 2, wherein the second transistor is a metal insulator semiconductor field effect transistor (MISFET).

5. The semiconductor device according to claim 1, wherein the second transistor is a metal insulator semiconductor field effect transistor (MISFET).

6. The semiconductor device according to claim 1, wherein
   the first transistor is a high electron mobility transistor (HEMT), and
   the second transistor is a metal insulator semiconductor field effect transistor (MISFET).

7. The semiconductor device according claim 1, wherein
   an anode of the diode is connected to the gate of the first transistor, and
   a cathode of the diode is connected to the second voltage source.

8. The semiconductor device according to claim 1, further comprising a delay circuit connected to an input of the second driver.

9. The semiconductor device according to claim 8, wherein the delay circuit is configured to delay a control signal provided to the second transistor for switching the second transistor from a conductive state to a nonconductive state.

10. The semiconductor device according to claim 9, wherein the delay circuit delays the control signal for a time that is longer than a switching period of the control signal.

11. The semiconductor device according to claim 8, further comprising:
    an inverter having an output connected to an input of the first driver, wherein the delay circuit includes:
       a second capacitor connected between an input of the second driver and the second voltage source;
       a third transistor connected in parallel with the second capacitor between the input of the second driver and the second voltage source, a gate of the third transistor connected to an input of the inverter; and
       a constant current source connected to a drain of the third transistor and the input of the second driver.

12. A semiconductor device, comprising:
    a first transistor that is a normally-on element;
    a second transistor connected in series with the first transistor between a first voltage terminal and a second voltage terminal, the second transistor being a normally-off element;
    a diode connected between a gate of the first transistor and the second voltage terminal;
    a first capacitor connected to the gate of the first transistor;
    a first driver connected to the gate of the first transistor through the first capacitor and configured to output a first drive signal inversely corresponding to a first control signal provided to an input of the first driver; and
    a second driver connected to a gate of the second transistor and configured to output a second drive signal inversely corresponding to a second control signal provided to an input of the second driver.

13. The semiconductor device according to claim 12, wherein the input of the first driver and the input of the second driver are connected in common and the first and second control signals match each other.

14. The semiconductor device according to claim 12, further comprising a delay circuit connected to the input of the second driver and configured to receive the first control signal and output a delayed first control signal as the second control signal.

15. The semiconductor device according to claim 12, wherein
    the first transistor is a high electron mobility transistor (HEMT), and
    the second transistor is a metal insulator semiconductor field effect transistor (MISFET).

16. The semiconductor device according to claim 12, wherein
    an anode of the diode is connected to the gate of the first transistor, and
    a cathode of the diode is connected to the second voltage source.

17. A semiconductor device, comprising:
    a first switching element having a conductive path connectable to a load terminal, the conductive path being switchable between a conducting state and a non-conducting state according to a first control voltage applied to a control terminal of the first switching element, the conductive path of the first switching element being in the conducting state when the first control voltage is greater than or equal to a first threshold voltage and in the non-conducting state when the first control voltage is less than the first threshold voltage;
    a second switching element having a conductive path connected in series with the conductive path of the first switching element between the load terminal and a ground terminal, the conductive path of the second switching element being switchable between a conducting state and a non-conducting state according to a second control voltage applied to a control terminal of the second switching element, the conductive path of the second switching element being in the conducting state when the second control voltage is greater than or equal to a second threshold voltage and in the non-conducting state when the second control voltage is less than the first control voltage, the second threshold voltage being higher than the first threshold voltage;

a diode having an anode connected to the control terminal of the first switching element and a cathode connected to the ground terminal;

a first capacitor having a first side connected to the first control terminal and the anode of the diode;

a first inverter having an output connected to a second side of the first capacitor and an input connected to a control signal terminal at which a first control signal can be supplied, the first inverter configured to output the first control voltage in accordance with the first control signal; and a second inverter having an output connected to the control terminal of the second switching element and an input at which a second control signal can be supplied, the second inverter configured to output the second control voltage in accordance with the second control signal.

18. The semiconductor device according to claim 17, wherein the input of the first inverter is connected in common with the second inverter and the first and second control signals match each other.

19. The semiconductor device according to claim 17, further comprising a delay circuit connected to the input of the second inverter and configured to receive the first control signal and output a delayed first control signal as the second control signal.

* * * * *